(12) United States Patent
Taddiken et al.

(10) Patent No.: US 12,068,123 B2
(45) Date of Patent: Aug. 20, 2024

(54) SWITCH DEVICE, METHOD FOR OPERATING SWITCH DEVICE AND METHOD FOR MANUFACTURING SWITCH DEVICE

(71) Applicant: Infineon Technologies AG, Neubiberg (DE)

(72) Inventors: Hans Taddiken, Munich (DE); Dominik Heiss, Munich (DE); Christoph Kadow, Gauting (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 259 days.

(21) Appl. No.: 17/455,595

(22) Filed: Nov. 18, 2021

(65) Prior Publication Data

US 2022/0199343 A1 Jun. 23, 2022

(30) Foreign Application Priority Data

Dec. 18, 2020 (EP) .................................... 20215635

(51) Int. Cl.
*H01H 47/26* (2006.01)
*H01H 37/02* (2006.01)
*H01H 50/12* (2006.01)

(52) U.S. Cl.
CPC .................. *H01H 37/02* (2013.01)

(58) Field of Classification Search
CPC ..................................................... H01H 37/02

USPC .......................................................... 361/211
See application file for complete search history.

(56) References Cited

U.S. PATENT DOCUMENTS

| 7,679,950 | B2 * | 3/2010 | Philipp | ............... | G11C 13/0004 365/163 |
| 2012/0320670 | A1 * | 12/2012 | Kau | .................... | G11C 13/0069 365/163 |
| 2014/0191181 | A1 * | 7/2014 | Moon | ................ | H10N 70/8828 257/4 |
| 2016/0079019 | A1 | 3/2016 | Borodulin et al. | | |
| 2017/0062162 | A1 | 3/2017 | Sichenzia et al. | | |

OTHER PUBLICATIONS

El-Hinnawy, Nabil et al., "Low-loss latching microwave switch using thermally pulsed non-volatile chalcogenide phase change materials", Applied Physics Letters 105, 013501, Jul. 7, 2014, 6 pages.

* cited by examiner

*Primary Examiner* — Jared Fureman
*Assistant Examiner* — Lucy M Thomas
(74) *Attorney, Agent, or Firm* — Slater Matsil, LLP

(57) ABSTRACT

A switch device includes a phase change switch and a memory for storing a target state of the phase change switch. A controller determines a phase state of the phase change switch, and, if the state of the phase change switch does not correspond to the target state, controls a heater of the phase change switch to change the state of the phase changes switch to the target state.

15 Claims, 3 Drawing Sheets

SWITCH DEVICE, METHOD FOR OPERATING SWITCH DEVICE AND METHOD FOR MANUFACTURING SWITCH DEVICE

This application claims the benefit of European Patent Application No. 20215635, filed on Dec. 18, 2020, which application is hereby incorporated herein by reference.

TECHNICAL FIELD

The present application relates to switch devices and methods for operating and manufacturing switch devices.

BACKGROUND

The technical requirements for radio frequency (RF) applications using high frequencies, such as radar sensing and mobile communication according to the 5G standard, are increasing. In particular, switches having improved characteristics compared to state-of-the-art CMOS switches will be required to meet future demands. Phase change switches are considered as promising candidates for switching RF signals. Such phase change switches use a phase change material (PCM) which typically exhibits a higher electric conductivity in a crystalline phase state than in an amorphous phase state. By changing the phase state of the phase change material, a switching device including such a material may be switched on or off.

For example, to change the phase state from amorphous to crystalline, typically a heater is employed heating the phase change material causing crystallization. This switching on is also referred to as a set operation of the switching device. In this set operation, the heater is actuated in such a way that the temperature of the phase change material is above its crystallization temperature, typically about 250° C., but below the melt temperature of typically in a range of 600° C. to 900° C., for example. The length of the heating pulse caused by the heater is chosen such that any amorphous region present in the PCM can regrow into the crystalline phase state.

When switching off the switching device, also referred to as reset operation, the heater is actuated in such a way that the temperature of the PCM is raised above the melt temperature (for example above about 600° C. to 900° C.), followed by rapid cooldown which freezes the phase change material into an amorphous state.

Besides that intended switching, also an unintended switching of such a switch device may happen, for example due to overvoltage conditions. Such overvoltage conditions may for example be caused by an electrostatic discharge (ESD) event.

A high voltage discharge (e.g., in the kilovolt range) in such an electrostatic discharge event may cause heating of the phase change material and thus unintended switching of the state or setting of the switch to a mixed state where part of the PCM is crystalline and part amorphous. While usually electric circuits are protected against ESD events by dedicated ESD protection circuitry, this is difficult to implement for radio frequency applications, as providing such ESD protection circuitry coupled to the phase change switch may adversely affect the radio frequency behavior of the switch.

A related problem exists when starting up a system including phase change switches. In such cases, the state of the phase change switches may be unknown, and the phase change switches may be needed to be brought to a desired state by applying corresponding heating, as described above. This takes time, causes heat in the system, consumes current and counts against a number of switching cycles defining a lifetime of the switch device.

SUMMARY

A device as defined in claim 1, a method as defined in claim 10 and a method as defined in claim 14 are provided. The dependent claims define further embodiments.

According to an embodiment, a device is provided, comprising:
 a phase change switch including a phase change material and a heater,
 a memory configured to store a target state for the phase change switch, and
 a controller configured to determine a state of the phase change switch, to compare the determined state with the target state, and to control the heater of the phase change switch to change the state of the phase change switch to the target state if the state of the phase change switch does not correspond to the target state.

According to another embodiment, a method is provided, comprising:
 determining a state of a phase change switch including a phase change material and a heater,
 comparing the determined state to a stored target state, and
 changing the state of the phase change switch to the target state in case the determined state does not correspond to the target state.

According to another embodiment, a method is provided, comprising:
 forming a phase change switch including a phase change material and a heater, and
 forming a phase change memory including a further phase change material and a further heater concurrently with the phase change switch.

The above summary is merely intended to give a brief overview over some embodiments and is not to be construed as limiting in any way.

DETAILED DESCRIPTION OF ILLUSTRATIVE EMBODIMENTS

In the following, various embodiments will be described in detail referring to the attached drawings. The embodiments described hereinafter are to be taken as examples only and are not to be construed as limiting. For example, while in embodiments specific arrangements or components are provided, in other embodiments other configurations may be used.

Besides features (for example components, elements, acts, events or the like) explicitly shown and described, in other embodiments additional features may be provided, for example features used in conventional switch devices using phase change materials. For example, embodiments described herein relate to monitoring a state of a switch, which is based on a phase change material, and other components and features, like control circuitry for controlling a heater, radio frequency (RF) circuitry using the switch device and the like may be implemented in a conventional manner. Such additional components may be integrated with the described switch devices on the same substrate, but may also be provided separately for example on one or more separate chip dies, which in some implementations then may be combined with a switch device in a common package. Also, structural implementations, like providing phase change material on a substrate like a silicon substrate to implement a phase change switch, providing phase change material in a trench in a silicon substrate and the like may be performed in any conventional manner.

Figure 5:
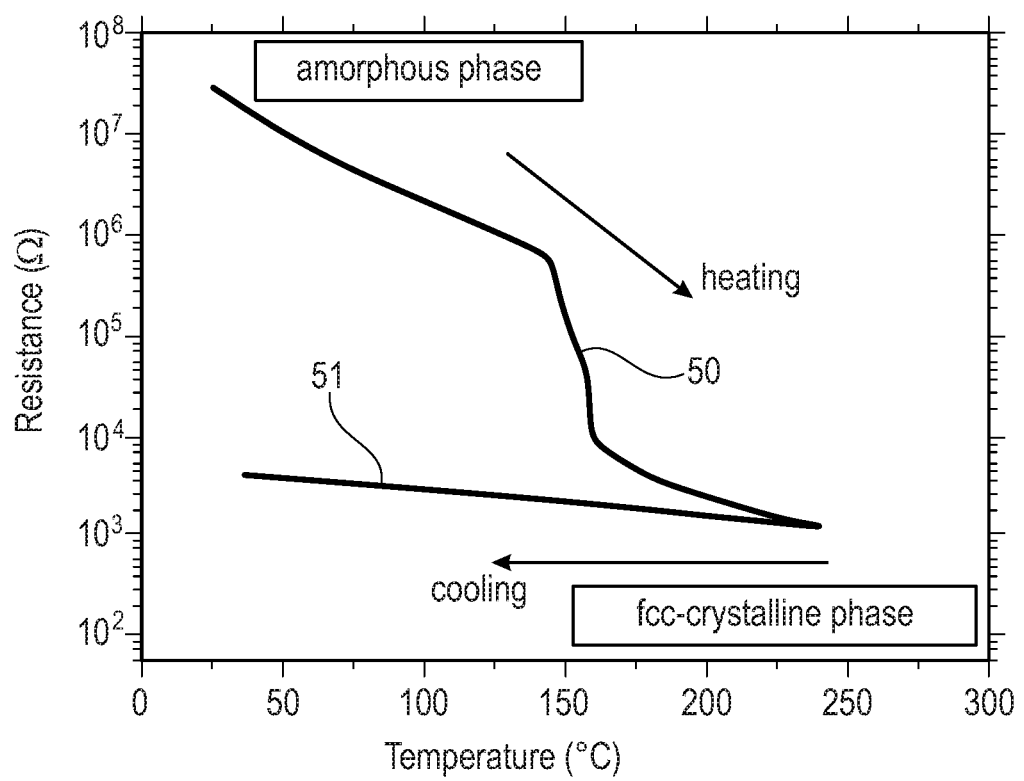
FIG. 5 is a diagram illustrating the behavior of an example phase change material.

A switch based on a phase change material (PCM) will be referred to as a phase change switch or short PCM switch herein. As explained in the introductory portion, such phase change switches may be set to a crystalline phase state or an amorphous phase estate, thus changing the resistance of the phase change material and therefore of the switch by several orders of magnitude. An illustrative example is shown in FIG. 5. FIG. 5 illustrates the resistance of an example phase change material over temperature. In an amorphous phase state, the example resistance is high, above 107 Ohm. By heating as illustrated by a curve portion 50 to about 250° C., the phase change material may be brought to a crystalline phase, in this case to a face-centered cubic (fcc) crystalline phase, which, as illustrated by a curve part 51, is preserved when cooling. The resistance in this case is then below 104 Ohm, i.e. more than three orders of magnitude lower. By using appropriate dimensions (length and width) of the phase change material for a PCM switch, an on-resistance of the switch for example in a range of 1 to 100 Ohm may be achieved.

Implementation details described with respect to one of the embodiments are also applicable to other embodiments. For example, with respect to FIG. 1 possible phase change materials and materials for a heater are described, and these may also be used in other embodiments described herein and will therefore not be described repeatedly.

Figure 1:
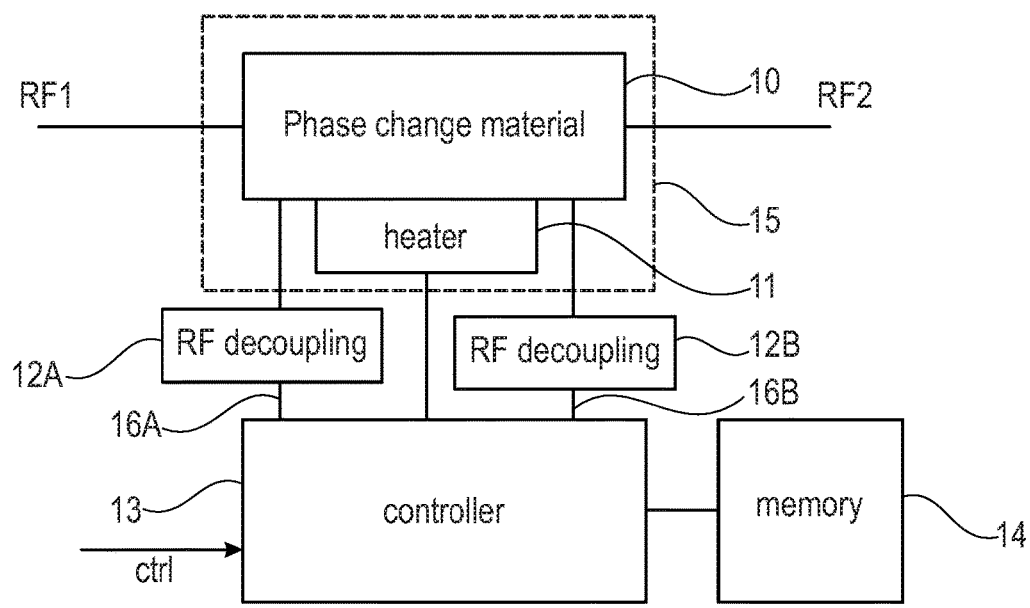
FIG. 1 is a block diagram of a device according to an embodiment.

Turning now to the figures, FIG. 1 illustrates a switch device according to an embodiment.

FIG. 1 comprises a phase change switch 15 including a phase change material 10 and a heater 11. Phase change material 10 is coupled between a first radio frequency terminal RF1 and a second terminal radio frequency terminal RF2, to selectively couple radio frequency terminal RF1 to radio frequency terminal RF2. In other embodiments, none-radio-frequency signals may be used. Radio frequency, in this respect, refers to signal having a frequency having at least 1 MHz, for example above 100 MHz, for example in the gigahertz (Ghz) range. Phase change switch 15 may for example be used in antenna tuning applications, to selectively couple capacitances or inductances to an antenna.

By being coupled between RF terminals RF1 and RF2, radio frequency switch 15 is prone to experiencing overvoltages for example due to electrostatic discharges (ESD) at an antenna as mentioned above or otherwise occurring at RF terminal RF1 or RF2. Moreover, as explained in the introductory portion, protecting phase change switch 15 by conventional ESD protection circuitry may negatively affect the radio frequency properties of switch device 15 and is therefore not desirable in some applications.

An example for a usable phase change material 10 is germanium telluride. Heater 11 may be made of materials like polycrystalline silicon or tungsten. Heater 11 is controlled by a controller 13 to switch phase change material 10 between the crystalline phase state and the amorphous phase state, as explained above with respect to FIG. 5. This may be done in response to a control signal ctrl provided to controller 13. This control may be performed in any conventional manner, as already mentioned above.

In addition to this conventional control, controller 13 is configured to monitor the state of phase change material 10 and therefore of phase change switch 15. For this monitoring, a voltage may be applied to phase change material 10 using connections 16A, 16B, and a corresponding current may be measured. In other embodiments, a predefined current may be applied via connections 16A, 16B, and the voltage drop over phase change material 10 may be measured. The voltage or current applied and the voltage or current measured may be DC voltages and currents, applied and measured via radio frequency decoupling elements 12A, 12B. Radio frequency decoupling elements 12A, 12B may for example be inductors, which exhibit a high impedance for RF signals, but a low impedance for DC signals, or high ohmic resistors. In this way, the monitoring by controller 13 in some embodiments does not significantly affect the radio frequency operation of phase change switch 15, i.e. the selective coupling of radio frequency terminals RF1 and RF2. While DC voltages and currents are used in the above example, in other embodiments also AC currents with a frequency lower than a frequency of radio frequency signals phase change switch 15 is designed for.

For example, if phase change switch 15 is designed to switch RF signals in the GHz range, for monitoring the state measurement signals (as the currents and voltages above) having a frequency at least a factor 10 or a factor 100 lower, for example 1 MHz or lower, may be used. Such a frequency different enables a design of radio frequency decoupling elements 12A, 12B that block the radio frequency signals, but let the measurement signals pass, for example as low pass filters (for which inductors are a simple example) having a cut-off frequency between the frequency of the RF signals and the frequency of the measurement signals.

By this monitoring, the state (set or reset) of phase change switch 15 may be measured. For example, phase change switch 15 may be designed to have an on resistance of 1 Ohm and an off resistance between 1 to 200 Kiloohm. By above measurement, the resistance (on, off or even intermediate) may be determined by controller 13.

A target state of phase change switch 15 is stored in a memory 14 coupled to controller 13. The target state is the state (set or reset) the phase change switch 15 is intended to be in, for example as determined by control signal ctrl.

Memory 14 may be any kind of suitable memory. In embodiments, memory 14 is a non-volatile memory. For example, memory 14 may include a flash memory. In some implementations, memory 14 may include a phase change memory. A phase change memory is a memory essentially corresponds to a phase change switch, where the state of the phase change material (set or reset) corresponds to a value (for example 1 or 0) stored in the memory. In case of implementation as a phase change memory, memory 14 may be manufactured together with phase change switch 15 concurrently, i.e. during the same processing stages. It should be noted that phase change memories in many implementations do not require a separate heater, but a direct heating e.g. using a heating current through the phase change material may also be used.

Controller 13 may compare the state of phase change switch 15 as measured with the target state stored in memory 14. In case of a deviation (i.e. state of phase change switch 15 does not correspond to the target state), controller 13 may control heater 11 to set or reset phase change switch 15 to the target state.

In some embodiments, the monitoring of the state of phase change switch 15 by controller 13 may be continuous. In such a situation, controller 13 may for example update the target state in memory 14 each time control signal ctrl indicates a change of the target state.

A first application example of this monitoring, in particular in case of continuous monitoring, is protection against undesired state changes of phase change switch 15. Such undesired changes, as already mentioned above, may be due to electrostatic discharges at terminals RF1 or RF2, which lead to heating of phase change material 10 and may therefore change the phase state of phase change switch 15. Such an inadvertent state change may then be detected by controller 13, and upon detection phase change switch 15 may be brought to the target state indicated by memory 14.

Additionally or alternatively, memory 14 may store a target state for starting up of a device including phase change switch 15. Usually, at such a startup, the state of phase change switches is undefined, and all switches used need to be set or reset, which consumes energy and causes heating. In embodiments, controller 13 determines if the state of phase change switch 15 at startup corresponds to the target state stored in memory 14, and only controls heater to bring phase change switch 15 to the target state in case of a deviation, i.e. if phase change switch 15 is not already in the target state. In this way, switching is only necessary if the state of phase change switch 15 differs from the target state. This may result in lower power consumption and also in a lower cycling rate of the switch (less switching events), which may extend the lifetime of phase change switch 15 in some embodiments.

In this case, no continuous monitoring needs to be performed, but the state of phase change switch 15 may be monitored by controller 13 only at startup.

It should be noted that the two approaches may be combined, i.e. memory 14 may store both a target state for startup and a target state during normal operation (the latter based for example on control signal ctrl), and the monitoring may be performed both at startup and continuously during normal operation. Instead of a continuous monitoring, also a monitoring in regular or irregular intervals is possible.

It should be noted that while phase change switch 15 may be prone to electrostatic discharge events as described above, even if memory 14 is implemented using a phase change material, it may be protected from electrostatic discharge event together with other parts of the device (for example controller 13) by conventional ESD protection circuitry, as memory 14 does not need to switch radio frequency signals and therefore an influence of the ESD protection circuitry on any RF performance is not a consideration here, in contrast to phase change switch 15.

Figure 2:
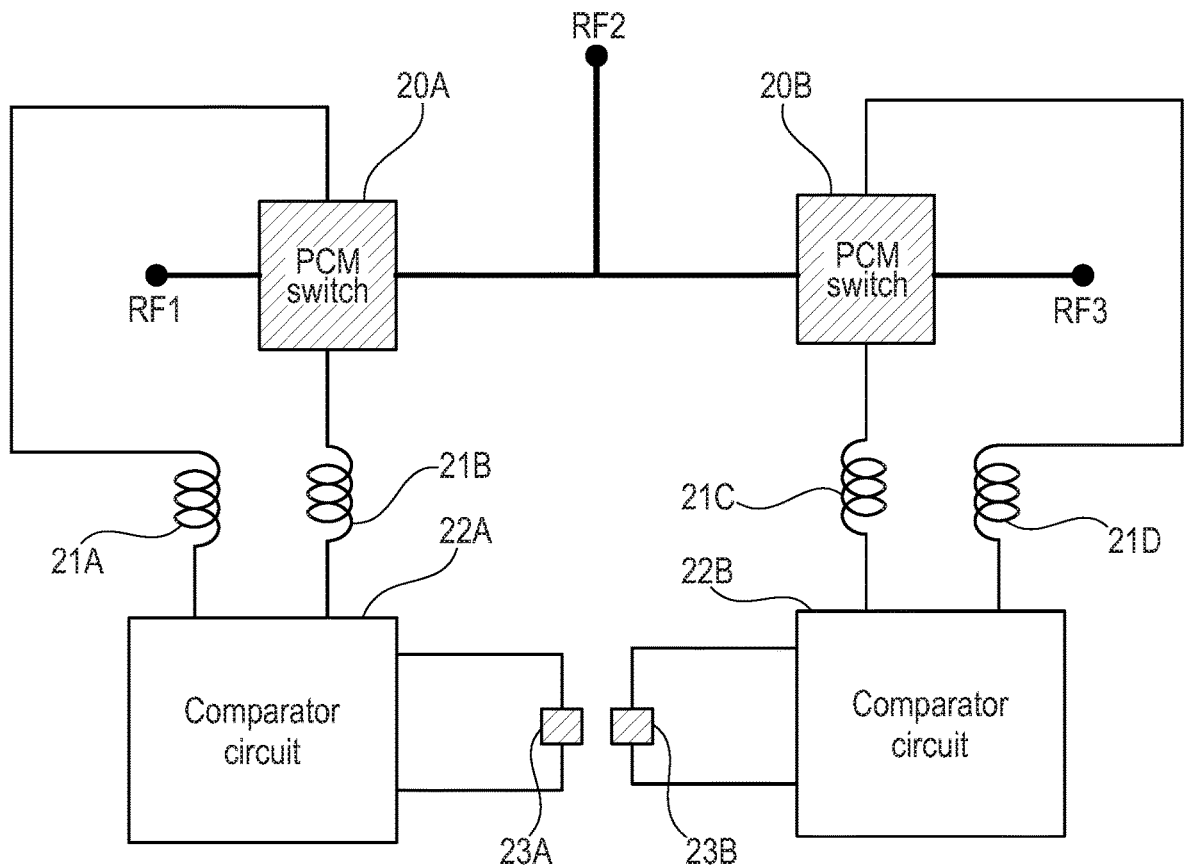
FIG. 2 is a diagram illustrating a device according to an embodiment.

FIG. 2 illustrates a device according to a further embodiment. In order to avoid repetitions, when describing the device of FIG. 2, reference will be made to the description of FIG. 1 for similar parts.

The embodiment of FIG. 2 comprises two phase change switches 20A, 20B provided in a single pole double throw (SPDT) configurations between radio frequency terminals RF1, RF2, RF3, as shown. Single pole double throw means that for example RF terminal RF2 may be selectively coupled to RF terminal RF1, RF terminal RF3 or both RF terminals RF1 and RF3, by operating phase change switches 20A and 20B accordingly. Such a configuration is for example sometimes used in antenna tuning applications or other RF applications. The SPDT configuration is only an example, and other switch configurations like general single pole multi throw (multi being double in the example of FIG. 2, but may also be triple etc.), single pole single throw (SPST), essentially shown in FIG. 1, double pole double throw (DPDT) etc. may also be used.

Each phase change switch 20A, 20B includes a phase change material and a heater, as explained for phase change switch 15 of FIG. 1, which is controlled by a controller (not fully shown in FIG. 2, see controller 13 of FIG. 1) to set or reset the respective phase change switch 20A, 20B.

For phase change switch 20A, a phase change memory 23A is provided storing a target state for phase change switch 20A, and for phase change switch 20B a phase change memory 23B is provided storing a target state for phase change switch 20B. This storing of a target state may be performed as explained for memory 14 of FIG. 1.

A comparator circuit 22A, which may be part of a controller like controller 13, is coupled to phase change switch 20A via decoupling inductors 21A, 21B, which are an example for decoupling elements 12A, 12B. Comparator circuit 22A provides one of a DC voltage or a DC current to phase change switch 20A via inductors 21A, 21B and measures the respective other one of DC voltage and DC current, as already explained for controller 13 in FIG. 1. Likewise, comparator circuit 22A provides one of a DC voltage or a DC current to phase change memory 23A and measures the other one of a DC voltage or a DC current, to read out phase change memory 23A. Comparator circuit 22A then compares the two measurements, which corresponds to comparing the phase change state of phase change switch 20A with the target state stored in phase change memory 23A, and provides the result for example to other parts of a controller like controller 13 of FIG. 1. As explained for FIG. 1, the controller may control a heater of phase change switch 20A to set phase change switch 20A to the target state in case the state is different from the target state. As explained with respect to FIG. 1, this may be done at startup, continuously or discontinuously during normal operation, or both.

In a similar manner, for phase change switch 20B a comparator circuit 22B, a phase change memory 23B and inductors 21C, 21D coupled between comparator circuit 22B and phase change switch 20B are provided, which serve the same function as comparator circuit 22A, phase change memory 23A, and inductors 21A and 21B for phase change switch 20A, and will therefore not be described again in detail.

While two phase change switches 20A, 20B are shown in FIG. 2, also more phase changes switches may be used, with a correspondingly higher number of comparator circuits and, phase change memories and inductors. Instead of phase change memories 23A, 23B, as explained for memory 14 of FIG. 1, other types of memories may be provided. For example, a flash memory may be provided which stores target states for both phase change switch 20A and a phase change switch 20B.

Inductors 21A to 21D are dimensioned such that they, for radio frequencies the device is intended to be used for, have a sufficiently high impedance such that the radio frequency switching operation of phase change switches 21A, 21B is essentially not influenced by the monitoring. It should be noted that in embodiments where monitoring is only performed at startup, RF decoupling elements 12A, 12B and corresponding inductors 21A to 21D may be omitted. The same applies to devices where for example a monitoring is performed discontinuously only during times where the RF switching operation of phase change switches 20A, 20B is not used, for example where no radio frequency signals are present or are processed.

Figure 3:
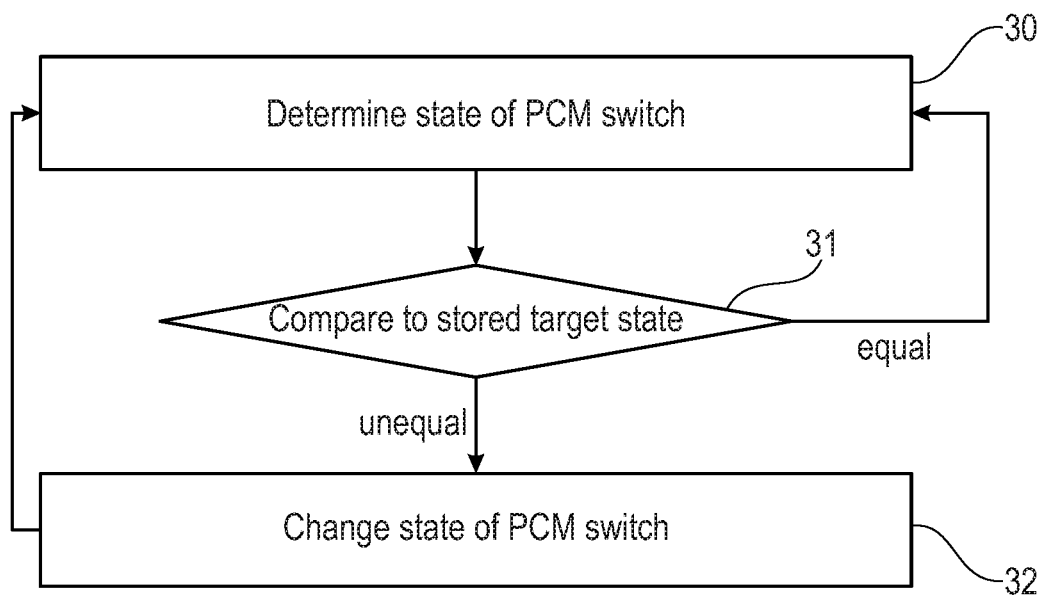
FIG. 3 is a flowchart illustrating a method for operating a switch device according to an embodiment.

FIG. 3 illustrates a method according to some embodiments. The method of FIG. 3 may be implemented using the devices shown in FIGS. 1 and 2 and, in order to avoid repetitions, will be explained referring to FIGS. 1 and 2. However, it is to be understood that the method of FIG. 3 may also be implemented using other devices.

At 30, the method of FIG. 3 comprises determining the state of a phase change switch. This determining may be done as explained with reference to FIGS. 1 and 2, i.e. by applying one of a DC voltage or a DC current to a phase change material of the phase change switch and measuring the other one of DC voltage and DC current.

At 31, the method comprises comparing the determined state to a stored target state, for example stored in memory 14 of FIG. 1 or phase change memory 23A or 23B of FIG. 2. If the states are equal, in case of continuous monitoring the determining at 30 and the comparing at 31 are performed continuously. If, for example if the method is performed only at startup, if the states are equal, the method ends, and normal operation follows.

If the states are unequal, at 32 the method comprises changing the state of the phase change switch to the target state, by controlling a heater like heater 11 of FIG. 1 accordingly. After 32, in case of continuous monitoring the determining at 30 and the comparing at 31 are repeated. Otherwise, for example if the method is performed only at startup, after 32 the method terminates, and normal operation follows.

Figure 4:
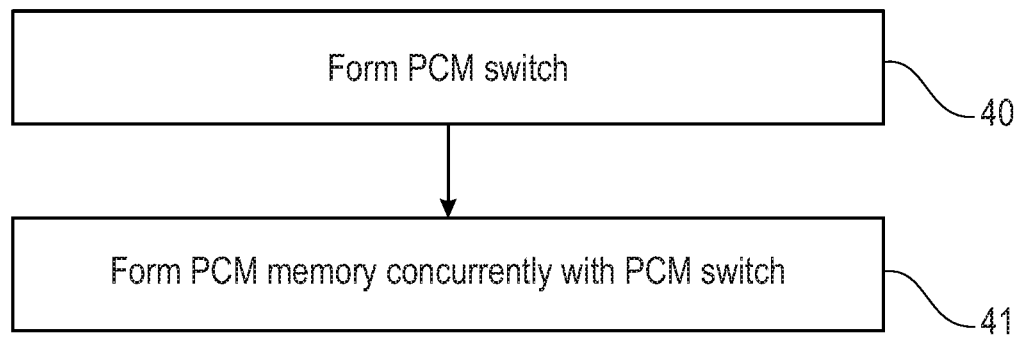
FIG. 4 is a flowchart illustrating a method for manufacturing a switch device according to some embodiments.

FIG. 4 is a flowchart illustrating a method for manufacturing a switch device according to an embodiment. The method of FIG. 4 may for example be used to manufacture the switch devices of FIGS. 1 and 2. The method of FIG. 4, however, may also be used to manufacture other switch devices, including switch devices which do not use a monitoring of the state of a phase change switch as explained above with reference to FIGS. 1 to 3.

At 40, the method comprises forming a phase change switch. This forming may include depositing a phase change material, depositing a heater material and electrically contacting the phase change material and the heater material.

At 41, the method comprises forming phase change memory concurrently with the phase change switch, i.e. during the same processing switch. For example, a phase change material for the phase change memory may be deposited in a same processing step as a phase change material of the phase change switch at 40, heater materials, if required for the phase change memory (as mentioned above, this need not be the case), may be deposited in the same process steps, contacts may be formed in the same process steps, structuring may be performed in the same steps etc. In this way, an efficient manufacturing of a phase change switch together with a phase change memory is possible in some embodiments.

Some embodiments are defined by the following examples:

Example 1

A device, comprising:
a phase change switch including a phase change material and a heater,
a memory configured to store a target state for the phase change switch, and
a controller configured to determine a state of the phase change switch, to compare the determined state with the target state, and to control the heater of the phase change switch to change the state of the phase change switch to the target state if the state of the phase change switch does not correspond to the target state.

Example 2

The device of Example 1, wherein the memory comprises a phase change memory including a further phase change material.

Example 3

The device of Example 1 or 2, wherein, to determine the state of the phase change switch, the controller is configured to apply one of a voltage and a current to the phase change material of the phase change switch and to measure the other one of a voltage and a current in response to the applying. The voltages and currents may be DC voltages and currents, but may also be AC voltages and currents with a frequency smaller, e.g. by at least a factor of 10, a factor of 100 or more smaller than a frequency of signals to be switched by the phase change switch in normal operation, e.g. RF signals.

Example 4

The device of any one of Examples 1 to 3, wherein the controller is coupled to the phase change switch via at least one radio frequency decoupling element. This coupling via the radio frequency decoupling element may serve for determining the state of the phase change switch by transmitting e.g., the current or voltage of example 3 via the radio frequency decoupling element.

Example 5

The device of Example 4, wherein the radio frequency decoupling element comprises an inductor.

Example 6

The device of any one of Examples 1 to 5, wherein the controller is configured to perform the determining and the comparing continuously during operation of the device.

Example 7

The device of any one of Examples 1 to 6, wherein the controller is configured to perform the determining and the comparing upon startup of the device.

Example 8

The device of any one of Examples 1 to 7, wherein the phase change switch is a radio frequency switch configured to switch radio frequency signals.

Example 9

The device of Example 8, wherein the phase change switch is coupled with a further phase change switch in a single pole multi throw configuration.

Example 10

A method, comprising:
determining a state of a phase change switch including a phase change material and a heater,
comparing the determined state to a stored target state, and
changing the state of the phase change switch to the target state in case the determined state does not correspond to the target state.

Example 11

The method of Example 10, wherein the determining the state comprises applying one of a voltage and a current to the phase change material, and measuring the other of a voltage and a current in response to the applying. The voltages and currents may be DC voltages and currents, but may also be AC voltages and currents with a frequency smaller, e.g. by at least a factor of 10, a factor of 100 or more smaller than a frequency of signals to be switched by the phase change switch in normal operation, e.g. RF signals.

Example 12

The method of Example 10 or 11, wherein the method is performed continuously during operation of a device including the phase change switch.

Example 13

The method of any one of Examples 10 to 12, wherein the method is performed at startup of a device including the phase change switch.

Example 14

A method, comprising:
forming a phase change switch including a phase change material and a heater, and
forming a phase change memory including a further phase change material concurrently with the phase change switch.

Example 15

The method of Example 14, wherein the method is adapted to manufacture the device of any one of Examples 1 to 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
a phase change switch including a phase change material and a heater, the phase change switch comprising first and second terminals configured to provide a first connection path between the first and second terminals, the phase change switch comprising third and fourth terminals configured to provide a second connection path between the third and fourth terminals, the phase change switch having a state corresponding with a resistance of the first connection path and corresponding with a resistance of the second connection path, the phase change switch comprising a fifth terminal configured to provide a control path to the heater, the first connection path, the second connection path, and the control path being different;
a memory configured to store a target state of the phase change switch; and
a controller configured to determine the state of the phase change switch based on the resistance of the second connection path of the phase change switch, to compare the determined state of the phase change switch with the target state of the phase change switch, and to control the heater of the phase change switch with the control path to change the state of the phase change switch to the target state if the state of the phase change switch does not correspond to the target state.

2. The device of claim 1, wherein the memory comprises a phase change memory including a further phase change material.

3. The device of claim 1, wherein, to determine the state of the phase change switch, the controller is configured to apply one of a voltage and a current to the second connection path of the phase change material of the phase change switch and to measure the other one of a voltage and a current in response to the applying.

4. The device of claim 1, wherein the controller is coupled to the second connection path of the phase change switch via at least one radio frequency decoupling element.

5. The device of claim 4, wherein the radio frequency decoupling element comprises an inductor.

6. The device of claim 1, wherein the controller is configured to perform the determining and the comparing continuously during operation of the device.

7. The device of claim 1, wherein the controller is configured to perform the determining and the comparing upon startup of the device.

8. The device of claim 1, wherein the phase change switch is a radio frequency switch configured to switch radio frequency signals.

9. The device of claim 8, wherein the phase change switch is coupled with a further phase change switch in a single pole multi throw configuration.

10. A method, comprising:
determining a state of a phase change switch including:
a phase change material,
a heater configured to heat the phase change material,
first and second terminals,
a first connection path between the first and second terminals,
third and fourth terminals,
a second connection path between the third and fourth terminals,
a fifth terminal,
the fifth terminal forming a control path for the heater,
the first connection path, the second connection path, and the control path being different,
the phase change switch having a state corresponding with a resistance of the first connection path and corresponding with a resistance of the second connection path,
wherein the state of the phase change switch is determined based on the resistance of the second connection path of the phase change switch;

comparing the determined state of the phase change switch to a stored target state of the phase change switch; and changing the state of the phase change switch with the control path to the target state in response to the determined state of the phase change switch not corresponding to the target state of the first connection path.

11. The method of claim 10, wherein the determining the state of the phase change switch comprises applying one of a voltage and a current to the phase change material with the third and fourth terminals, and measuring the other of a voltage and a current in response to the applying.

12. The method of claim 10, wherein the method is performed continuously during operation of a device including the phase change switch.

13. The method of claim 10, wherein the method is performed at startup of a device including the phase change switch.

14. A method, comprising:
providing a phase change switch including:
a phase change material,
a heater configured to heat the phase change material,
first and second terminals,
a first connection path between the first and second terminals,
third and fourth terminals,
a second connection path between the third and fourth terminals,
a fifth terminal,
the fifth terminal forming a control path for the heater,
the first connection path, the second connection path, and the control path being different, and
the phase change switch having a state corresponding with a resistance of the first connection path and corresponding with a resistance of the second connection path;

providing a phase change memory including a further phase change material concurrently with the phase change switch;

determining a state of the second connection path of the phase change switch;

comparing the determined state of the second connection path with a target state of the phase change switch; and controlling the heater of the phase change switch with the control path to change the state of the phase change switch to the target state if the state of the second connection path of the phase change switch does not correspond to the target state of the phase change switch.

15. The method of claim 14, wherein determining the state of the second connection path of the phase change switch, comparing the determined state of the second connection path with the target state of the phase change switch, and controlling the heater of the phase change switch are performed by a controller.

* * * * *